United States Patent [19]

Canfield et al.

[11] Patent Number: 5,063,580
[45] Date of Patent: Nov. 5, 1991

[54] APPARATUS FOR CONDITIONING A CONTROL SIGNAL

[75] Inventors: Barth A. Canfield, Indianapolis, Ind.; Russell T. Fling, Naperville, Ill.

[73] Assignee: Thomson Consumer Electronics, Inc., Indianapolis, Ind.

[21] Appl. No.: 520,204

[22] Filed: May 7, 1990

[51] Int. Cl.[5] ........................................... H03K 21/02
[52] U.S. Cl. .................................. 377/55; 377/39; 377/45; 328/147
[58] Field of Search ........................... 377/39, 45, 55; 328/146, 147, 149

[56] References Cited

U.S. PATENT DOCUMENTS

| | | | |
|---|---|---|---|
| 3,989,931 | 11/1976 | Phillips | 377/55 |
| 4,086,538 | 4/1978 | Foreman | 328/147 |
| 4,220,849 | 9/1980 | Harzer | 377/55 |
| 4,321,460 | 3/1982 | Mohammadioun | 377/45 |
| 4,635,102 | 1/1987 | Bolger | 358/27 |
| 4,715,051 | 12/1987 | Giardina | 377/45 |
| 4,757,464 | 7/1988 | Zimmermann et al. | 377/39 |

*Primary Examiner*—John S. Heyman
*Attorney, Agent, or Firm*—Joseph S. Tripoli; Eric P. Herrmann; Ronald H. Kurdyla

[57] ABSTRACT

Apparatus for controlling the time constant of a signal includes an up/down counter for counting pulses of a clock signal. The count value is utilized as output signal. The output signal is compared with the input signal to provide a first control signal determinative of whether the counter counts up or down. The output signal is compared with the input signal offset by a constant value to provide a signal which is ORed with the first control signal, and the ORed signal is utilized to enable/disable the counter. Applying a constant offset value to the input signal to be compared precludes the system from alternately counting up and down by one unit value during intervals of relatively constant amplitude input signals.

6 Claims, 3 Drawing Sheets

APPARATUS FOR CONDITIONING A CONTROL SIGNAL

This invention relates to circuitry for controlling the rate of change of a control signal.

BACKGROUND OF THE INVENTION

Many systems, such as television receivers, video cassette recorders, audio signal processors, etc., generate control signals to condition the systems to operate reliably for input signals occurring within a range of amplitude or frequency parameters. An example of such control signals in a television receiver include automatic gain control (AGC) signals and automatic chrominance control (ACC) signals. These control signals are generally generated in a closed loop subsystem including for example a gain controlling element having an input terminal for receiving a signal to be controlled and an output terminal at which parametrically controlled input signal is available. Control signals are generated by apparatus which is responsive to the controlled output signal, for measuring a particular parameter of the signal against a reference value, and, producing, e.g., a difference value for controlling the control element.

In many systems it is undesirable for abrupt changes in control signals to be applied immediately to the signal controlling element, because abrupt signal changes may produce adverse affects. For example, abrupt changes in AGC signals may produce flicker in a reproduced video image. Therefore, control signals are frequently coupled to the signal controlling element via a low pass filter.

Currently many of the aforementioned systems are being implemented with digital hardware wherein signals are processed in binary signal format. (Herein "binary signal" is intended to mean sampled data signals formed of ones and zeroes defining numbers representative of a parameter (e.g., amplitude) of a signal, and is meant to include binary signals, two's complement signals, BCD signals, grey code signals, etc.) When processing signals in binary format (hereinafter digital format) it may be inconvenient for various reasons to realize certain processing functions with circuitry which is a simple digital analogue of an analog circuit. An example is a digital low pass filter having a long time constant which may require many sample delay elements, weighting circuits and digital summing circuits.

SUMMARY OF THE INVENTION

The present invention includes circuitry for controlling the time constant of a signal. The circuitry includes means for incrementing or decrementing stored values that correspond to an output signal having a controlled time constant. Comparator circuitry, responsive to the output signal and the input signal, conditions the means for incrementing or decrementing the stored value to selectively increment or decremented the stored values at predetermined rates.

DETAILED DESCRIPTION

Figure 1:
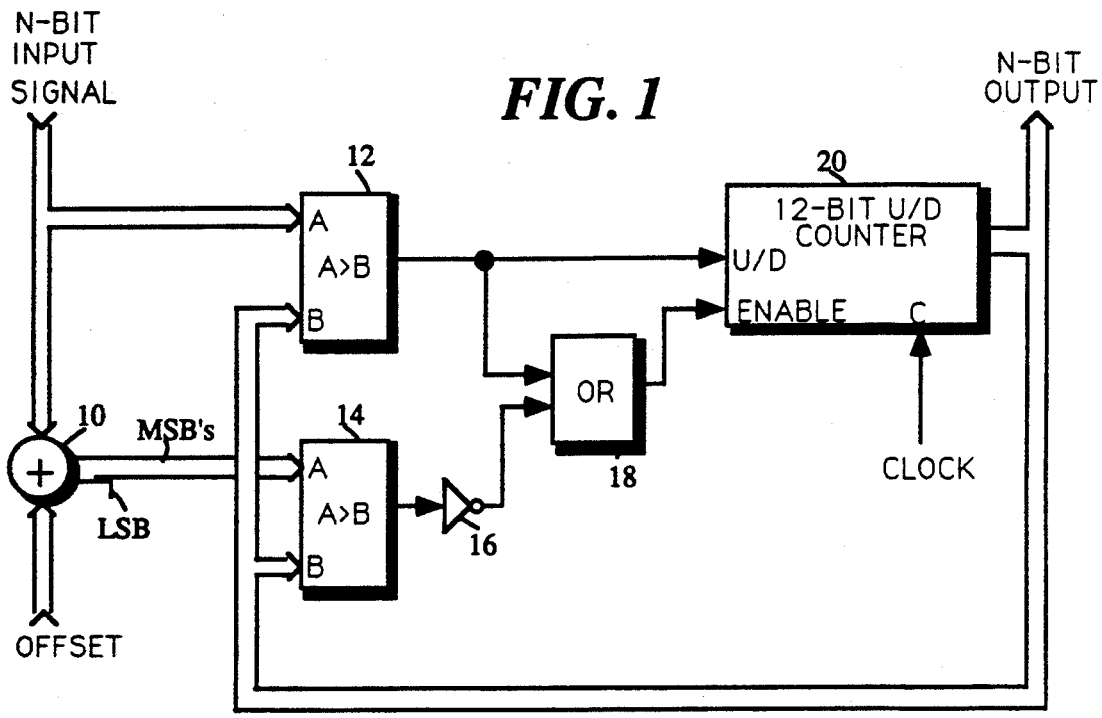
FIGS. 1 and 2 are block diagrams of alternative digital signal conditioning circuitry embodying the invention.

FIG. 1 illustrates a digital embodiment of apparatus for conditioning a signal. In FIG. 1 the "Input Signal" to be conditioned is assumed to be in N-bit parallel bit format and the conditioned signal, "Output", is also assumed to be in N-bit parallel bit format. The output signal is generated by a P-bit up/down counter 20 ($P \geq N$) but only the N most significant bits of the count values provided by the counter 20 are utilized in the output signal.

The input signal is applied to one input port, A, of a comparator 12 and the output signal is coupled to a second input port, B, of the comparator 12. Comparator 12 provides a logic one output signal value whenever the input signal exceeds the output signal, and provides a logic zero output value otherwise. The logic levels provided by the comparator 12 are coupled to the up/down (U/D) control terminal of the counter 20. Logic one and zero U/D control values condition the counter 20 to count up and down respectively.

The input signal is also coupled to a signal summer 10. An offset number of constant value is applied to a second input of the signal summer 10. Signal summer 10 provides an output signal which equals the sum of the input signal and the offset number. Nominally a signal summer arranged to sum N-bit values has an $N+1$ bit output port. Only the N most significant bits of the output signal provided by the signal summer are utilized. The offset number is of relatively small value, e.g., 2 to 6.

The output signal provided by the signal summer 10 is coupled to one input port, A, of a comparator 14, and the output signal is coupled to a second input port, B. Comparator 14 provides a logic one output value whenever the signal provided by the summer 10 exceeds the output signal, and provides a logic zero output value otherwise. The output signal provided by comparator 14 is applied to an inverter 16 wherein the logic values are inverted (complemented).

The output signals from comparator 12 and the inverter 16 are coupled to respective input terminals of a two-input OR gate 18. The output signal of the OR gate 18 is coupled to an enable terminal of the counter 20. The output signal provided by the OR gate 28 enables the counter to increment/decrement when it is a logic one value and precludes the counter from incrementing/decrementing when it is a logic zero value.

A clock signal (CLOCK) is applied to a clock input terminal C of the counter 20, and when counter 20 is enabled, counter 20 increments/decrements the current count value contained therein by one unit for each clock pulse. Assuming that counter 20 is a 12-bit counter and that $N=7$, the N-bit output signal will increment/decrement at most by one unit every 32 clock pulses. The time constant, i.e., slew rate of the output signal is determined by the frequency of the clock signal. The frequency of the clock signal is therefore a design choice.

Operation of the circuitry of FIG. 1 will be described with reference to the signal waveforms of FIG. 3. With respect to FIG. 3, the input signal, INPUT, and the output signal, OUTPUT, are drawn in analog form for convenience. The assumption is made that the sample rate of the input signal is much greater than the frequency of the clock signal, CLOCK, which is applied to the counter. A further assumption is that P is equal to N, that is, counter 20 is an N-bit counter. Thus the output signal will increment/decrement for each clock signal when the counter is enabled. The signal INPUT is coupled to the A input port of comparator 12 and the signal INPUT PLUS OFFSET is coupled to the A input port of comparator 14. The signal OUTPUT is coupled to the respective B input ports of comparators 12 and 14. The waveforms $A>B_{12}$ and $A>B_{14}$ are the output signals provided by comparators 12 and 14 respectively for the given input signals. The waveform ENABLE is the output signal provided by the OR gate 18.

At times $t_1-t_4$ the counter 20 is enabled and the output of comparator 12 is high. During this interval the counter 20 is conditioned to increment its count value by one unit per cycle of the signal clock. It can be seen that the signal OUTPUT slews positively at a rate which is relatively slow compared to the slew rate of the signal INPUT.

At times $t_5-t_{10}$ the counter 20 is again enabled, however during this interval the output of comparator 12 is low, thus the counter 20 is conditioned to decrement its count value. The signal OUTPUT decreases by one unit per cycle of the clock signal, producing a negative going slew rate which is relatively long compared to the negatively going slew rate of the signal INPUT. At all other times illustrated the enable signal is low, precluding the counter from incrementing or decrementing. During these times the last count value is stored in the counter.

The comparator 12 enables the counter to follow positive going input signal changes and the comparator 14 plus the inverter 16 enables the counter to follow negative going input signal changes. The offset value applied to the input signal that is coupled to comparator 14 is incorporated to preclude the system from alternately incrementing and decrementing by one unit when the input signal is at a relatively constant value, for example between times $t_4$ and $t_5$.

Figure 3:
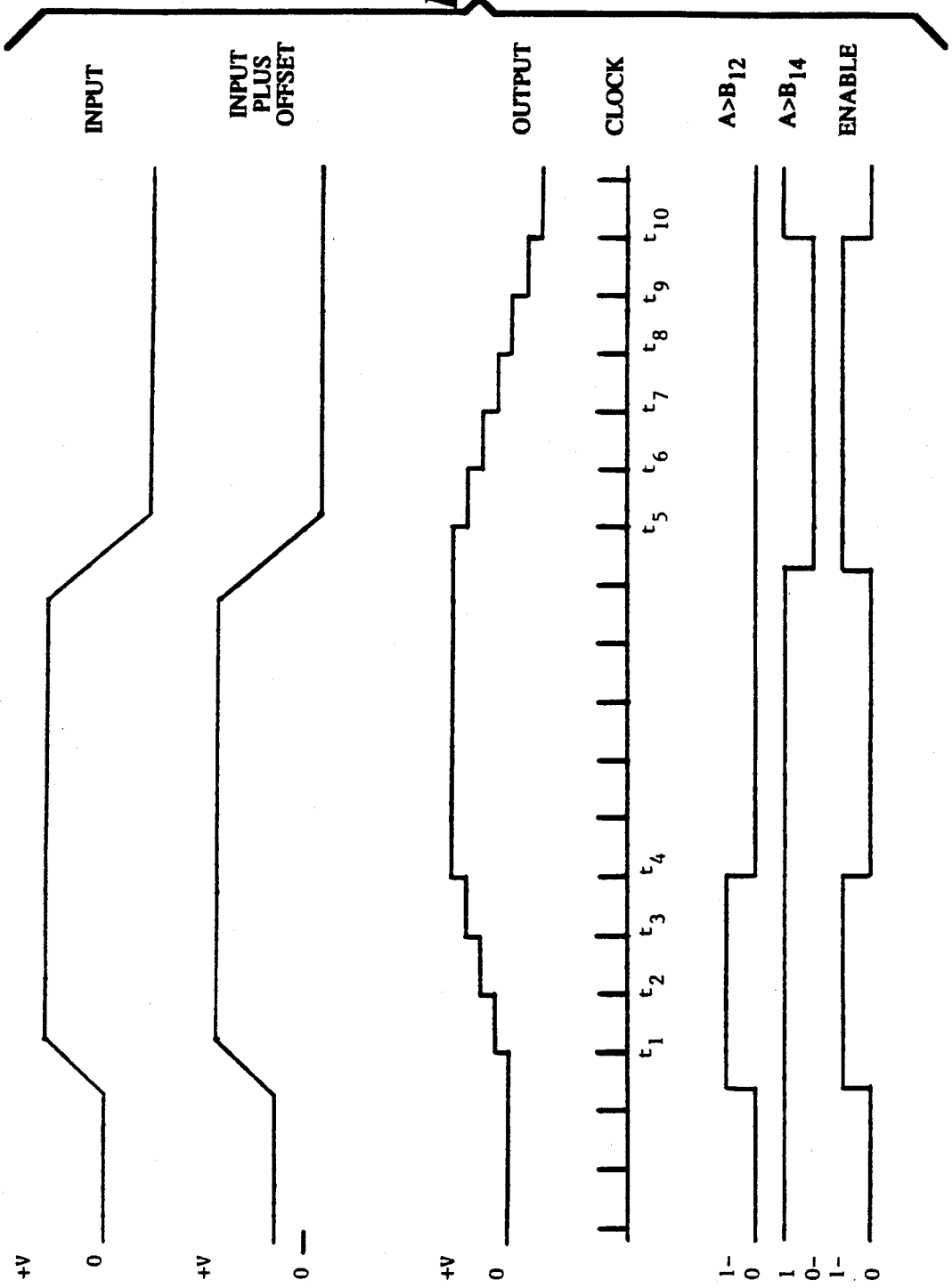
FIG. 3 illustrates waveforms useful for understanding operation of the invention.

As illustrated in FIGS. 1 and 3 the positive and negative going slew rates of the signal OUTPUT are equal. They may be made unequal by selectively applying clock signals of different frequencies to the counter 20 during incrementing and decrementing intervals. The output signal from comparator 12 may be utilized to select between two clock signals that are to be applied to the counter.

As illustrated in FIG. 3 the output signal was incremented/decremented by one unit for each clock cycle because P was assumed to be equal to N. Alternatively is P is greater than N by Q bits, the output signal will be incremented/decremented by one unit for every 2Q clock cycles.

Figure 2:
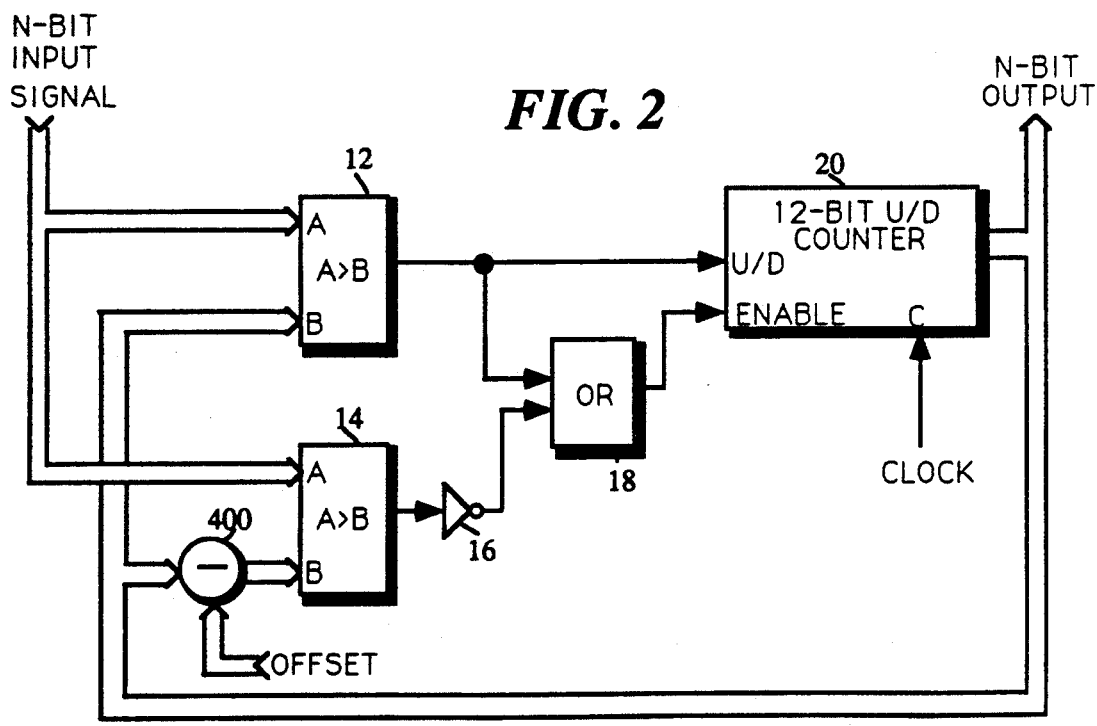

The apparatus shown in FIG. 2 is similar to the apparatus shown in FIG. 1 with the exception that the signal offset is applied to the output signal coupled to comparator 14 rather than to the input signal applied to comparator 14. In FIG. 2 the offset value and the output signal are respectively coupled to the subtrahend and minuend input ports of a subtracter 400 wherein the constant offset valued is subtracted from the output signal. The output signal minus the offset value produced by the subtracter are coupled to the B input port of comparator 14. Operation of the circuit is similar to that described with respect to the FIG. 1 circuit.

Regarding both the FIGS. 1 and 2 circuits, if the dynamic range of the input signal encompasses all possible values that can be represented by an N-bit signal, it should be appreciated that the output values of the signal summer 10 and the subtracter 400 can overflow and underflow. Overflow and underflow must be prevented or the circuitry will generate erroneous results. This may be accomplished by clamping the output values provided by the summer 10 or subtracter 400 to values corresponding to the limits of their dynamic range during intervals when over and/or underflow occur. Such circuitry is known to those skilled in the art of digital signal processing and will not be discussed herein.

Figure 4:
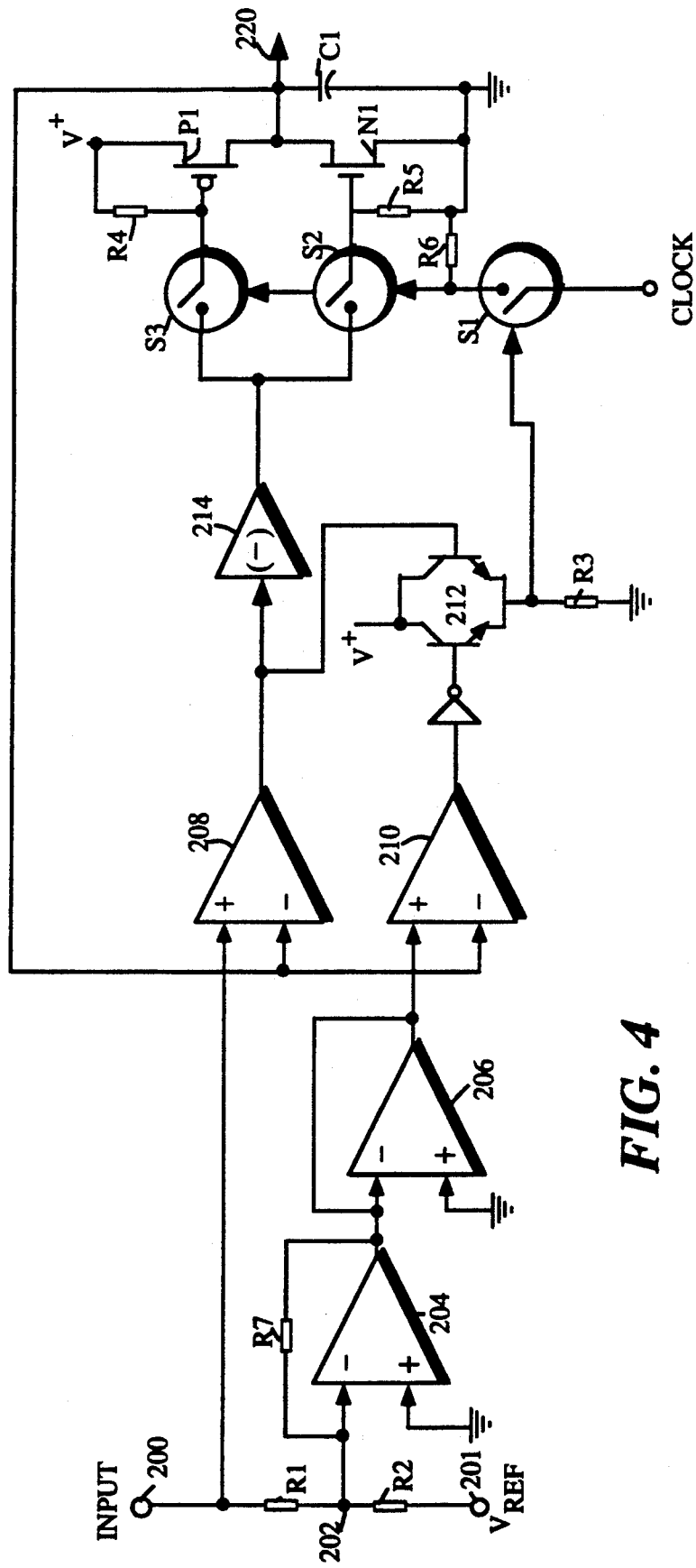
FIG. 4 is a partially block and partially schematic diagrams of an analog control signal conditioning circuit embodying the invention.

FIG. 4 illustrates an analog embodiment of the invention. This circuitry may be utilized on an integrated circuit where it is necessary to provide a relatively long time constant to a signal. It has the advantage over a simple low pass filter in that it utilizes a relatively low valued capacitance which may be realized in integrated form.

In FIG. 4, analog input signal is coupled to terminal 200 and the offset value, Vref, is coupled to terminal 201. Output signal is available from connection 220. Input and output signals are coupled to respective input terminals of a comparator 208 which corresponds to the comparator 12 in FIG. 1. Input signal and the offset value are applied to a node 202 via resistors R1 and R2. Resistors R1, R2, R7 and amplifiers 204 and 206 form a voltage summing network. The resistors R1, R2 and R7 have equal values, and the amplifier 204 is assumed to have high gain, thus the output signal provided by the amplifier 206 is equal to Vinput plus Voffset, where Vinput and Voffset are the amplitude values of the input and offset signals. The input signal plus offset and the output signal are coupled to respective input terminals of a comparator 210, which corresponds to the comparator 14 in FIG. 1. Comparators 208 and 210 provide high level output signals only when signal applied to their (+) input terminals exceeds signal applied to their (−) input terminals, and provide low level output signals otherwise.

Output signal provided by the comparators 108 and 210 are applied to respective input terminals of an analog OR gate including emitter coupled transistors 212 and resistor R3. The output of the OR gate is coupled to control a switch S1, to selectively pass a signal, Clock, to further switches S2 and S3. The clock signal, when coupled to switches S2 and S3, closes switches S2 and S3 when it exhibits a high level pulse and opens switches S2 and S3 when it exhibits a low level. Resistor R6 coupled between the control terminal of switches S2 and S3 and ground potential, insures that switches S2 and S3 are open in the absence of clock pulses.

Output signal from comparator 208 is inverted in a buffer amplifier 214 and coupled to respective signal input terminals of the switches S2 and S3. Signal output terminals of the switches S2 and S3 are respectively coupled to the control electrodes of a p-type transistor P1 and an n-type transistor N1 connected to operate as gated current sources with respect to connection 220. An integrating capacitor C1 is coupled between connection 220 and a point of fixed potential.

Transistor P1 applies charging current to capacitor C1 when its control electrode is biased relatively negatively and is effectively open circuited when its control electrode is biased relatively positively. Transistor N1 applies discharging current to capacitor C1 when its control electrode is biased relatively positively and is effectively open circuited when its control electrode is biased relatively negatively. Resistor R4 coupled between the control electrode of transistor P1 and a positive supply potential, and resistor R5 coupled between the control electrode of transistor N1 and ground, insure that transistors P1 and N1 are biased off when switches S2 and S3 are open.

When switch S1 is closed (enabled) by the OR gate the capacitor C1 is selectively charged or discharged depending upon whether the output of comparator 208 is high or low valued, respectively. The increments of charge (or discharge) are dependent upon the width of the clock pulses and the parameters of transistor P1 (N1). Positive and negative output slew rates will be equal or different depending upon the relative design parameters selected for transistors P1 and N1.

The output signal at connection 220 will increment-/decrement by a unit of charge for each clock pulse when switch S1 is closed. This rate of response may be lengthened by including an attenuator in the feedback path between the output (220) and the input terminals of comparators 208 and 210.

What is claimed is:

1. Signal conditioning apparatus comprising:
   an input terminal for receiving an input signal;
   an output terminal for providing an output signal;
   a source of offset signal;
   means coupled to said input terminal and said source, for summing said offset signal and said input signal to provide an offset input signal;
   means, responsive to said input and output signals, for providing a first signal having first and second states when said input signal is greater and lesser than said output signal respectively;
   means, responsive to said offset input signal and said output signal, for providing a second signal having second and first states when said offset input signal is greater and lesser than said output signal respectively;
   means for generating said output signal, including means for storing said output signal, and responsive to the state exhibited by said first signal, for incrementing or decrementing said output signal if either of said first and second signals exhibit a predetermined one of said first and second states.

2. The signal conditioning apparatus set forth in claim 1 wherein said means, including means for storing said output signal, comprises:
   an up/down counter, having an output port for providing said output signal, and which is enabled to count responsive to either of said first and second signals exhibiting a predetermined state, and which is conditioned by said first signal to increment said output signal when said first signal exhibits a predetermined one of said first and second states and to decrement said output signal when said first signal exhibits the other of said first and second states.

3. The signal conditioning apparatus set forth in claim 1 wherein said means for providing a first signal having first and second states when said input signal is greater and lesser than said output signal respectively comprises a comparator having first and second input terminals for applying said input and output signals respectively, and arranged to provide a logic high output value only when said input signal exceeds said output signal.

4. The signal conditioning apparatus set forth in claim 1 wherein said means for providing a second signal having second and first states when said offset input signal is greater and lesser than said output signal respectively comprises:
   a comparator having first and second input terminals for applying said offset input and output signals respectively, and arranged to provide a logic high output value only when said input signal exceeds said output signal; and
   means, coupled to said comparator, for inverting output values provided by said comparator, to generate said second signal.

5. Apparatus for conditioning a binary signal comprising:
   an input terminal for receiving a binary input signal;
   an output terminal for providing a binary output signal;
   a source of binary offset signal;
   means coupled to said input terminal and said source, for summing said binary offset signal and said binary input signal to provide a binary offset input signal;
   a first comparator having first and second input terminals for applying said binary input and binary output signals respectively, and arranged to provide a logic high output value only when said binary input signal exceeds said binary output signal;
   a second comparator having first and second input terminals for applying said binary offset input and binary output signals respectively, and arranged to provide a logic high output value only when said binary offset input signal exceeds said binary output signal.
   means, coupled to said second comparator, for inverting output values provided by said second comparator;
   an OR circuit for logically ORing signals provided by said first comparator and said means for inverting, to generate an enable signal;
   an up/down counter having an up/down control terminal coupled to said first comparator, an enable terminal coupled to said OR circuit, a clock input terminal for receiving a clock signal, and having a count output terminal coupled to said output terminal.

6. Signal conditioning apparatus comprising:
   an input terminal for receiving an input signal;
   an output terminal for providing an output signal;
   means, responsive to said input and output signals, for providing a first signal having first and second states when said input signal is greater and lesser than said output signal respectively;
   means, responsive to said input signal and said output signal, for providing a second signal exhibiting said second state when said input signal is greater than said output signal by a predetermined offset value, and exhibiting said first state otherwise;
   means, including means for storing an said output signal, responsive to the state exhibited by said first signal, and for incrementing or decrementing said said output signal if either of said first and second signals exhibit a predetermined one of said first and second states.

* * * * *